(12) United States Patent
Chen et al.

(10) Patent No.: US 7,137,084 B1
(45) Date of Patent: Nov. 14, 2006

(54) SIMILARITY-DRIVEN SYNTHESIS FOR EQUIVALENCE CHECKING OF COMPLEX DESIGNS

(75) Inventors: Kuang-Chien Chen, Fremont, CA (US); Chih-Chang Lin, San Jose, CA (US); Cheng-Ta Hsieh, San Jose, CA (US); Yifeng Wang, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 140 days.

(21) Appl. No.: 10/832,771

(22) Filed: Apr. 26, 2004

Related U.S. Application Data

(63) Continuation of application No. 10/037,844, filed on Oct. 19, 2001, now Pat. No. 6,742,174.

(51) Int. Cl.
*G06F 17/50* (2006.01)

(52) U.S. Cl. .................. 716/4; 716/2; 716/18

(58) Field of Classification Search .............. 716/1, 716/2, 11, 18, 4, 17
See application file for complete search history.

(56) References Cited

U.S. PATENT DOCUMENTS

| | | | |
|---|---|---|---|
| 5,519,627 A | 5/1996 | Mahmood et al. | |
| 5,841,663 A | 11/1998 | Sharma et al. | |
| 6,148,436 A | 11/2000 | Wohl | |
| 6,163,876 A | 12/2000 | Ashar et al. | |
| 6,336,206 B1 | 1/2002 | Lockyear | |
| 6,378,112 B1 | 4/2002 | Martin et al. | |
| 6,490,717 B1 | 12/2002 | Pedersen et al. | |
| 6,530,073 B1 | 3/2003 | Morgan | |
| 6,611,947 B1 | 8/2003 | Higgins et al. | |
| 2001/0010090 A1* | 7/2001 | Boyle et al. | 716/2 |

OTHER PUBLICATIONS

Brand, D., "Verification of Large Synthesized Designs," Proc. 1993 IEEE Int'l. Conf. on CAD, Nov. 1993, pp. 534-537.
Burch, J.R. et al., "Symbolic Model Checking for Sequential Circuit Verification," IEEE Transactions on, Apr. 1994, pp. 401-424.
Kuehlmann, A., "Equivalence Checking Using Cuts and Heaps," IBM Thomas J. Watson Research Center, Yorktown Heights, NY U.S.A., 1997, pp. 263-268.
Pawlovsky, et al., "Verification of Register Transfer Level (RTL) Designs," IEEE International Conference, 1989, pp. 91-94.

(Continued)

*Primary Examiner*—Thuan Do
(74) *Attorney, Agent, or Firm*—Bingham McCutchen LLP

(57) ABSTRACT

A method for modeling a circuit design includes synthesizing the circuit design to create a first gate-level representation of the circuit design. The method also includes analyzing a second gate-level representation of the circuit design to learn architecture information, and resynthesizing the first gate-level representation of the circuit design to incorporate the learned architecture information from the second gate-level representation of the circuit design. A computer-readable storage medium has stored thereon computer instructions that, when executed by a computer, cause the computer to synthesize a circuit design to create a first gate-level representation of the circuit design. The computer instructions also cause the computer to analyze a second gate-level representation of the circuit design to learn architecture information, and resynthesize the first gate-level representation of the circuit design to incorporate the learned architecture information from the second gate-level representation of the circuit design.

12 Claims, 9 Drawing Sheets

OTHER PUBLICATIONS

Stoffel, D. et al., "Logic Equivalence Checking by Optimization Techniques," Proc. Int'l. Workshop on CAD, Test and Evaluation for Dependability, Jul. 1996, pp. 85-90.

Vakilotojar, et al., "RTL Verification of Timed Asynchronous and Heterogeneous Systems Using Symbolic Model Checking," IEEE Design Automation Conference, 1997, pp. 181-188.

* cited by examiner

Verilog Example For Resource Sharing Learning

```
module example(in1,in2,in3,in4,in5,in6,in7,in8,sel,y);
input [3:0] in1,in2,in3,in4,in5,in6,in7,in8;
input [2:0] sel;
output [7:0] y;
reg [7:0] y;

always @(in1 or in2 or in3 or in4 or in5 or in6 or in7 or in8 or sel) begin
   case(sel)
      1:
         y = in1 * in2;    // multiplier m1
      2:
         y = in3 * in4;    // multiplier m2
      3:
         y = in5 * in6;    // multiplier m3
      default:
         y = in7 * in8;    // multiplier m4
   endcase
end endmodule
```

Fig. 3

(a) Sharing Pair Examples

Sharing (m1,m2)

Sharing (m3,m4)

(b) Golden Circuit (c) Revised Circuit (a) Golden Netlist (b) Revised Netlist (c) Learning Steps

SIMILARITY-DRIVEN SYNTHESIS FOR EQUIVALENCE CHECKING OF COMPLEX DESIGNS

RELATED APPLICATIONS

This application is a continuation of U.S. application Ser. No. 10/037,844 filed on Oct. 19, 2001, which issued as U.S. Pat. No. 6,742,174 on May 25, 2004, and which is hereby incorporated by reference in its entirety for all purposes as if fully set forth herein.

BACKGROUND

The present invention relates generally to functional verification of circuit designs and, more particularly, to synthesis techniques used in constructing logic networks used in the functional verification process.

I. Description of the Related Art

Today, integrated circuits (ICs) typically contain large numbers of circuit elements. Computer-aided design (CAD) and computer-aided engineering (CAE) tools are essential in assisting circuit designers to produce these complicated ICs. Circuit designs are typically represented in a user-specified hardware description language (HDL), which demonstrate the functional properties of the circuit.

Designers commonly utilize CAE software to translate a HDL representation, which is typically in Register-Transfer-Level (RTL) description, into a gate-level netlist representation, and perform design validation to ensure that no design errors occurred in the process. With increasing design complexity, formal verification (equivalence checking) becomes integral in the design process to ensure that a refinement of the original specification (commonly referred to as revised circuit or design) is equivalent to the original specification (commonly referred to as golden circuit or design).

Conventional verification methods utilize Binary Decision Diagrams (BDDs) to represent the logic circuits involved in equivalence relationships. A primary drawback to using BDDs is their exponential memory complexity associated with large complex designs. The exponential memory complexity associated with using BDDs limits its applicability.

Various methods that attempt to address the deficiencies inherent in using BDDs have been presented. (See e.g., J. Jain, R. Mukherjee, and M. Fujita, *Advanced Verification Techniques Based on Learning*, Proc. $32^{nd}$ ACM/IEEE DAC, June 1995, 420–26; W. Kunz, HANNIBAL: *An Efficient Tool for Logic Verification Based on Recursive Learning*, Proc. 1993 IEEE, Intl. Conf. On CAD, November 1993, 538–43; Y. Matsunaga, *An Efficient Equivalence Checker for Combinatorial Circuits*, Proc. $33^{rd}$ ACM/IEEE DAC, June 1996, 629–34; A. Kuehlmann, F. Krohm, *Equivalence Checking Using Cuts and Heaps*, Proc. Int. Conf. Computer-Aided Design, 1997).

These techniques rely on the existence of intermediate functions that occur in the specification and in the implementation of the circuit design. The intermediate functions are utilized as cut points to partition a complex circuit network into a set of smaller and simpler comparisons. In general, there is a correlation between the number of cut points and equivalence checking performance. Therefore, it is preferable to create a golden circuit that is synthesized to have high structural similarity to the revised circuit to increase the possibility of obtaining more cut points. However, the aforementioned techniques fail to address generating golden circuits having a high number of cut points.

Thus, systems and methods for creating a golden circuit having high structural similarity to the revised circuit is desired. Verification systems incorporating synthesis methods that allow it to efficiently determine the architecture of a revised circuit, and subsequently use that knowledge to construct logic networks having an architecture closely resembling the revised circuit is also desired.

SUMMARY

The present invention provides a system and corresponding methods for enhancing the capability of verifying functional equivalence of circuits. The system and methods identify and uncover an underlying architecture of a revised circuit, and uses the extracted information to construct logic networks having an architecture that closely resembles the architecture of the revised circuit. The logic networks can be used to create a golden circuit having enhanced similarity to the revised circuit.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein.

In one embodiment, a method for modeling a circuit design includes: synthesizing a circuit design to create a first gate-level representation of the circuit design; analyzing a second gate-level representation of the circuit design to learn architecture information; and resynthesizing the first gate-level representation of the circuit design to incorporate the learned architecture information from the second gate-level representation of the circuit design.

In another embodiment, analyzing a second gate-level representation of the circuit design includes: identifying a first subcircuit in a first gate-level representation of the circuit design; identifying a second subcircuit in the second gate-level representation of the circuit design, the second subcircuit corresponding to the first subcircuit; and calculating a similarity between the first subcircuit and the second subcircuit.

In still another embodiment, a computer-readable storage medium has stored thereon computer instructions that, when executed by a computer, cause the computer to: synthesize a circuit design to create a first gate-level representation of the circuit design; analyze a second gate-level representation of the circuit design to learn architecture information; and resynthesize the first gate-level representation of the circuit design to incorporate the learned architecture information from the second gate-level representation of the circuit design.

In yet another embodiment, a computer-readable storage medium has stored thereon computer instructions that, when executed by a computer, cause the computer to: identify a first subcircuit in a first gate-level representation of a circuit design; identify a second subcircuit in a second gate-level representation of the circuit design, the second subcircuit corresponding to the first subcircuit; and calculate a similarity between the first subcircuit and the second subcircuit.

A technical advantage of the present invention includes providing a design verification system and method that synthesizes a circuit design to create a first gate-level representation of the circuit design. The design verification system then extracts logic network information from a second representation of a circuit design. The extracted information is then used to resynthesize the first representation of the circuit design. Thus, the first representation is created to have logic network architecture and structure that is similar to that contained in the first representation. The similar logic architecture and structure provides increased efficiency in performing functional equivalence verification between the first and second representation of the circuit design.

These and other embodiments of the present invention will also become readily apparent to those skilled in the art from the following detailed description of the embodiments having reference to the attached figures, the invention not being limited to any particular embodiment(s) disclosed:

BRIEF DESCRIPTION OF THE DRAWINGS

FIG. 3 illustrates a code example for four multipliers in a golden circuit.

DETAILED DESCRIPTION

Figure 1:
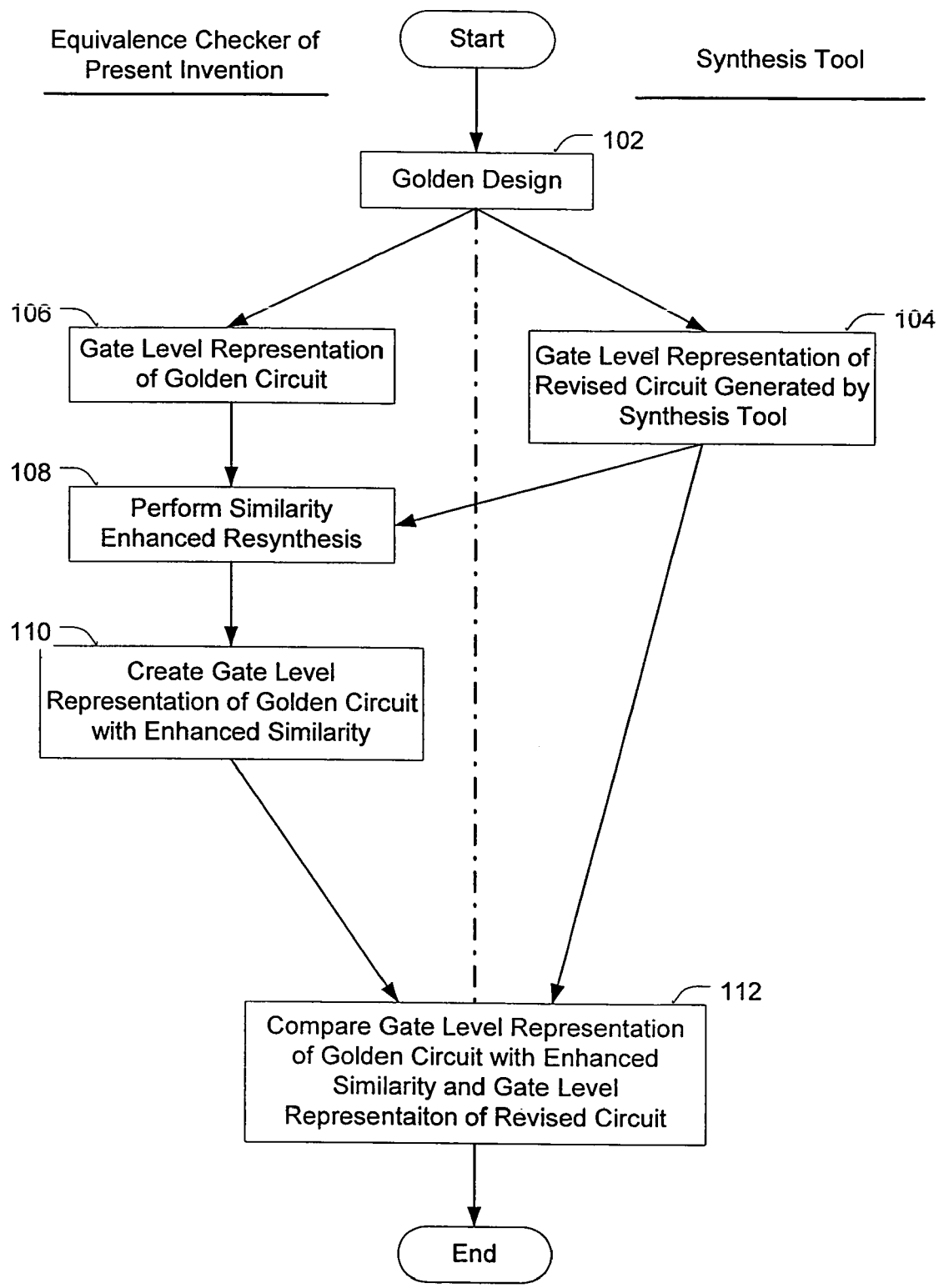
FIG. 1 is a flow chart illustrating an overall process for verifying a circuit design, according to one embodiment.

The preferred embodiments of the present invention and their advantages are better understood by referring to FIGS. 1 through 8 of the drawings. Throughout the drawings, like numerals are used for like and corresponding parts of the various drawings.

Turning first to the nomenclature of the specification, the detailed description that follows is presented largely in terms of processes and symbolic representations of operations performed by conventional computers, including computer components. A computer may be any microprocessor or processor (hereinafter referred to as processor) controlled device such as, by way of example, personal computers, workstations, servers, clients, mini-computers, main-frame computers, laptop computers, a network of one or more computers, mobile computers, portable computers, handheld computers, palm top computers, set top boxes for a TV, interactive televisions, interactive kiosks, personal digital assistants, interactive wireless devices, mobile browsers, or any combination thereof. The computer may possess input devices such as, by way of example, a keyboard, a keypad, a mouse, a microphone, or a touch screen, and output devices such as a computer screen, printer, or a speaker. Additionally, the computer includes memory such as a memory storage device or an addressable storage medium.

The computer may be a uniprocessor or multiprocessor machine. Additionally the computer, and the computer memory, may advantageously contain program logic or other substrate configuration representing data and instructions, which cause the computer to operate in a specific and predefined manner as, described herein. The program logic may advantageously be implemented as one or more modules. The modules may advantageously be configured to reside on the computer memory and execute on the one or more processors. The modules include, but are not limited to, software or hardware components that perform certain tasks. Thus, a module may include, by way of example, components, such as, software components, processes, functions, subroutines, procedures, attributes, class components, task components, object-oriented software components, segments of program code, drivers, firmware, micro-code, circuitry, data, and the like.

The program logic conventionally includes the manipulation of data bits by the processor and the maintenance of these bits within data structures resident in one or more of the memory storage devices. Such data structures impose a physical organization upon the collection of data bits stored within computer memory and represent specific electrical or magnetic elements. These symbolic representations are the means used by those skilled in the art to effectively convey teachings and discoveries to others skilled in the art.

The program logic is generally considered to be a sequence of computer-executed steps. These steps generally require manipulations of physical quantities. Usually, although not necessarily, these quantities take the form of electrical, magnetic, or optical signals capable of being stored, transferred, combined, compared, or otherwise manipulated. It is conventional for those skilled in the art to refer to these signals as bits, values, elements, symbols, characters, text, terms, numbers, records, files, or the like. It should be kept in mind, however, that these and some other terms should be associated with appropriate physical quantities for computer operations, and that these terms are merely conventional labels applied to physical quantities that exist within and during operation of the computer.

The program logic can be maintained or stored on a computer-readable storage medium. The term "computer-readable storage medium" refers to any medium that participates in providing the symbolic representations of operations to a processor for execution. Such media may take many forms, including, without limitation, volatile memory, nonvolatile memory, electronic transmission media, and the like. Volatile memory includes, for example, dynamic memory and cache memory normally present in computers. Nonvolatile memory includes, for example, optical or magnetic disks.

It should be understood that manipulations within the computer are often referred to in terms of adding, comparing, moving, searching, or the like, which are often associated with manual operations performed by a human operator. It is to be understood that no involvement of the human operator may be necessary, or even desirable. The operations described herein are machine operations performed in conjunction with the human operator or user that interacts with the computer or computers.

It should also be understood that the programs, modules, processes, methods, and the like, described herein are but an exemplary implementation and are not related, or limited, to any particular computer, apparatus, or computer language. Rather, various types of general purpose computing machines or devices may be used with programs constructed in accordance with the teachings described herein. Similarly, it may prove advantageous to construct a specialized apparatus to perform the method steps described herein by way of dedicated computer systems with hard-wired logic or programs stored in non-volatile memory, such as, by way of example, read-only memory (ROM).

II. Design Verification Overview

FIG. 1 is a flow chart illustrating an overall process for verifying a circuit design, according to one embodiment. In particular, given a golden circuit and a revised circuit, a design verification system and method of the present invention creates a gate-level representation of the golden circuit that has enhanced similarity with the revised circuit. The golden circuit with the enhanced similarity and the revised circuit can then be efficiently compared to verify the functional equivalence of the revised and golden circuits.

Beginning at a start step, a circuit designer creates a golden circuit using, for example, a CAD and/or CAE product (step 102). RTL description may be used to describe the logic networks in the golden circuit. The circuit designer can then use, for example, a synthesis tool to synthesize the golden circuit to perform design validation. In the synthesis procedure, the synthesis tool creates a revised circuit, which is a gate-level representation of the golden circuit (step 104).

The circuit designer can then use a design verification system of the present invention to verify that the golden circuit and the revised circuit are functionally equivalent. The design verification system compares the golden circuit to the revised circuit to make sure no bugs or errors were introduced during the synthesis procedure (i.e., during the procedure that generated the revised circuit).

In one embodiment, a logic circuit synthesizer component of the design verification system creates a gate-level representation of the golden circuit (step 106). For example, the logic circuit synthesizer component can read in the RTL description of the golden circuit and synthesize the RTL description into a gate-level format representation of the golden circuit. The logic circuit synthesizer component can then perform similarity enhanced resynthesis of the existing gate-level format representation of the golden circuit (step 108). Similarity enhanced resynthesis generally involves resynthesizing the gate-level representation of the golden circuit to be similar in structure and/or architecture to the gate-level representation in the revised circuit.

In one embodiment, the similarity enhanced resynthesis includes, without limitation, four different resynthesis techniques: Resource Sharing Learning, Operator Order Learning, Multiplier Learning, and Operator Merging Learning. Each learning technique analyzes the possible transformations that the logic circuit synthesizer component may apply or the design alternatives that the revised circuit could select, and then measures the similarity between the design alternative and revised circuit. After the analysis is done, the logic circuit synthesizer can perform a resynthesis by replacing the appropriate subcircuits in the golden circuit with the design alternative or alternatives in the revised circuit having the highest similarity. Resource Sharing Learning, Operator Order Learning, Multiplier Learning, and Operator Merging Learning are further discussed below.

For example, in resynthesizing the golden circuit, the logic circuit synthesizer component identifies a subcircuit in the golden circuit. The logic circuit synthesizer component identities and analyzes the structure of a corresponding subcircuit in the revised circuit using one or any combination of the aforementioned resynthesis techniques. If the structure of the subcircuit in the golden circuit is not similar to the structure of the corresponding subcircuit in the revised circuit, the logic circuit synthesizer component resynthesizes the subcircuit in the golden circuit to have a structure that is similar or identical to the structure of the corresponding subcircuit in the revised circuit.

As used herein, "similar," "similarity," or any variant thereof when used in conjunction with or used to describe one or more characteristics of circuits, circuit designs, subcircuits, and subcircuit designs, including architectures, means having a large number of internal equivalent boolean functions. The number can be a percentage number that depends on the synthesized subcircuit. The number that determines similarity may be a predetermined threshold number in the design verification, system of the present invention.

Referring again to FIG. 1, the logic circuit synthesizer component uses the information gleaned from analyzing the revised circuit to create a gate-level representation of the golden circuit that has enhanced similarity with the revised circuit (step 110). The design verification system can then efficiently compare the golden circuit and the revised circuit to determine if the two circuits are functionally equivalent (step 112). The design verification system can report the comparison results and/or make the results available for review, and ends processing.

In another embodiment, the logic circuit synthesizer component can analyze the revised circuit and apply the learned information to transform the RTL description of the golden circuit to a gate-level description of the golden circuit. Thus, the design verification system synthesizes the RTL description of the golden circuit and creates a gate-level representation that is similar to the gate-level representation of the revised circuit.

Those of ordinary skill in the art will appreciate that, for this and other methods disclosed herein, the functions performed in the exemplary flow charts may be implemented in differing order. Furthermore, steps outlined in the flow charts are only exemplary, and some of the steps may be optional, combined into fewer steps, or expanded into additional steps without detracting from the essence of the invention.

III. Resource Sharing Learning

Figure 2:
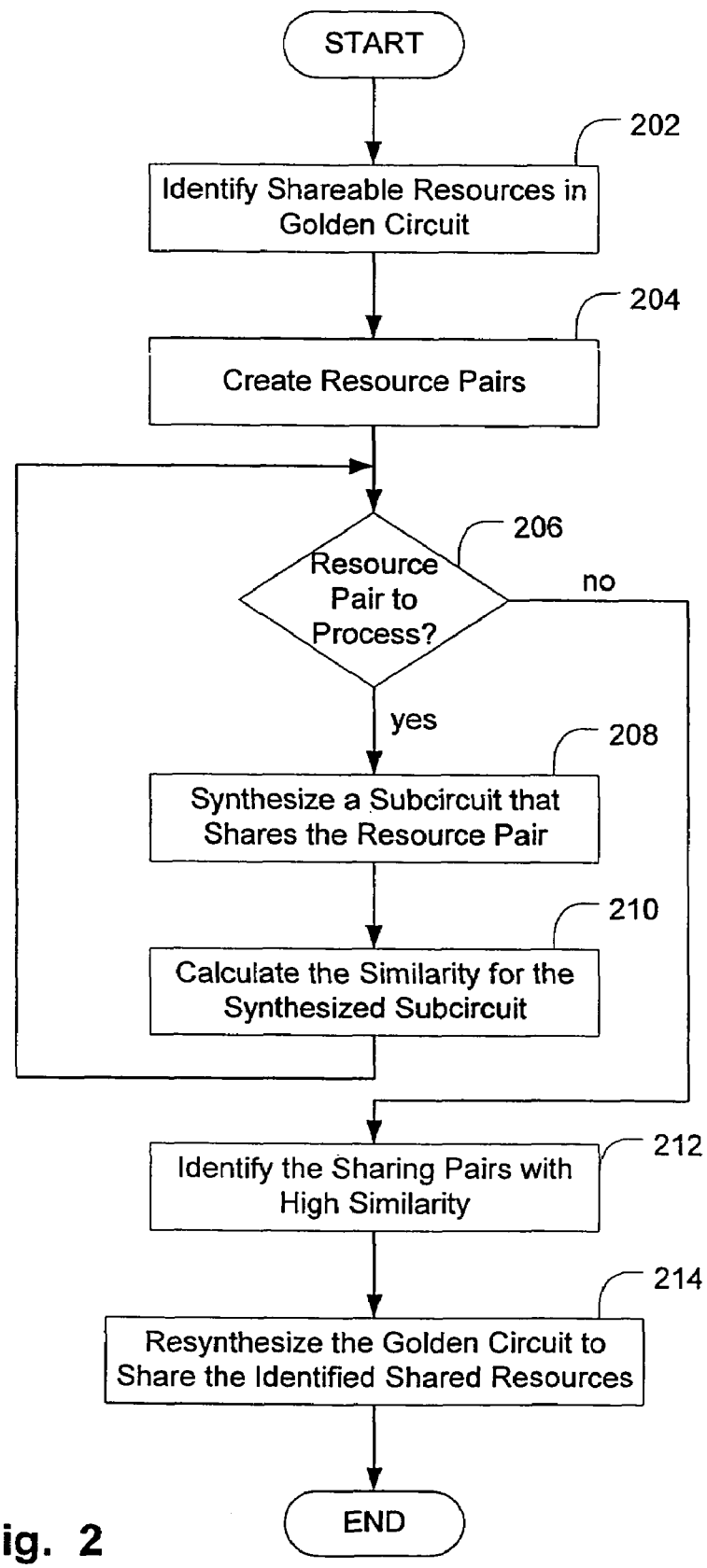
FIG. 2 is a flow chart of an exemplary method for performing resource sharing learning, according to one embodiment.

FIG. 2 is a flow chart of an exemplary method for performing resource sharing learning, according to one embodiment. For example, a circuit designer may have previously created a revised circuit by performing a synthesis procedure on a previously created golden circuit. The circuit designer may then use the design verification system off the present invention to check the equivalence of the golden and revised circuit to ensure that no errors were introduced during the synthesis process.

The design verification system receives as input the golden circuit and generates a gate-level representation of the golden circuit. For example, a synthesis component in the design verification system can transform the RTL description to a gate-level representation. In checking the functional equivalence between the previously created golden circuit and its corresponding revised circuit, the design verification system can perform resource sharing learning by analyzing the golden circuit and identifying one or more sharable resources in the golden circuit (step 202). A resource may be an operation such as, by way of example, a multiplier, a divider, an adder, a subtractor, and the like. A sharable resource exists if two resources will never be utilized simultaneously and, thus, is likely to be shared in the revised circuit to save circuit area.

The design verification system creates and enumerates resource pairs from the identified sharable resources (step 204). For each enumerated resource pair (step 206), the design verification system synthesizes a subcircuit that shares the resource pair (step 208). For example, the design verification system creates a gate-level representation of a subcircuit that shares the resource pair being processed. Thus, the design verification system makes a guess as to the resource pair's subcircuit.

The design verification system then analyzes the revised circuit to identify a subcircuit that is similar to the synthesized subcircuit. Having identified a corresponding subcircuit in the revised circuit, the design verification system calculates a similarity between the synthesized subcircuit and the corresponding subcircuit (step 210). In one embodiment, the design verification system focuses on the output of the synthesized subcircuit to find the corresponding subcircuit in the revised circuit. Methods to calculate the similarity of two subcircuits are further discussed below.

The design verification system synthesizes a subcircuit (step 208) and calculates the similarity of the synthesized subcircuit (step 210) for each enumerated resource pair. Having processed the enumerated resource pairs, the design verification system identifies the resource pairs that have high similarity to the corresponding subcircuits in the revised circuit (step 212). The design verification system then resynthesizes the golden circuit to share the identified resource pairs (step 214). Thus, the resynthesized golden circuit shares resources in a manner similar to that found in the revised circuit. The design verification system processes the sharable resources in the golden circuit and ends processing.

By way of example, resource sharing learning can involve multipliers in a golden circuit. FIG. 3 illustrates a Verilog code example for four multipliers m1, m2, m3, and m4 in a golden circuit. The four multipliers, m1, m2, m3, and m4 can potentially be shared in the revised circuit. Thus, it will be efficient to share the multipliers in a similar manner in the golden circuit.

Figure 4A:
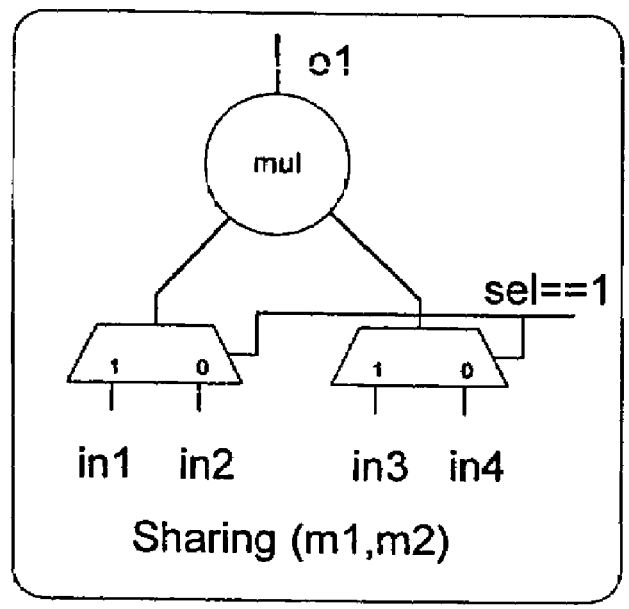
FIGS. 4A–C illustrate a resource sharing learning flow example of the multipliers in FIG. 3.
Figure 4A:
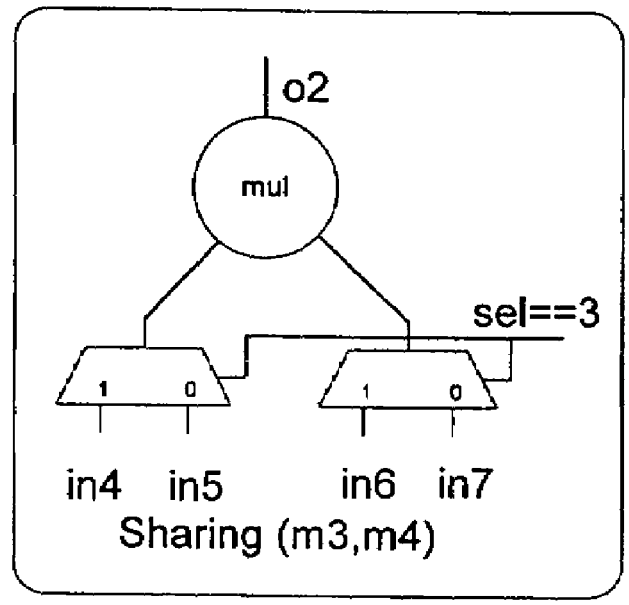

To learn how the resources are shared in revised circuit, the possible pair-wise sharing of the four multipliers (e.g., (m1, m2), (m1, m3), (m1, m4), (m2, m3), (m3, m4), etc.) are first enumerated. For example, FIG. 4A depicts an exemplary representation of a multiplier that shares (m1, m2) and a multiplier that shares (m3, m4). A subcircuit is synthesized for each multiplier sharing pair and will be tried and applied on the golden circuit when the conditional similarity is high. Here, conditional similarity means the similarity is measured subject to the condition that the resource pair is utilized. For example, in the Verilog code example in FIG. 3, multiplier sharing (m1, m2) similarity is checked under the condition (sel==1 or set==2).

Figure 4B:
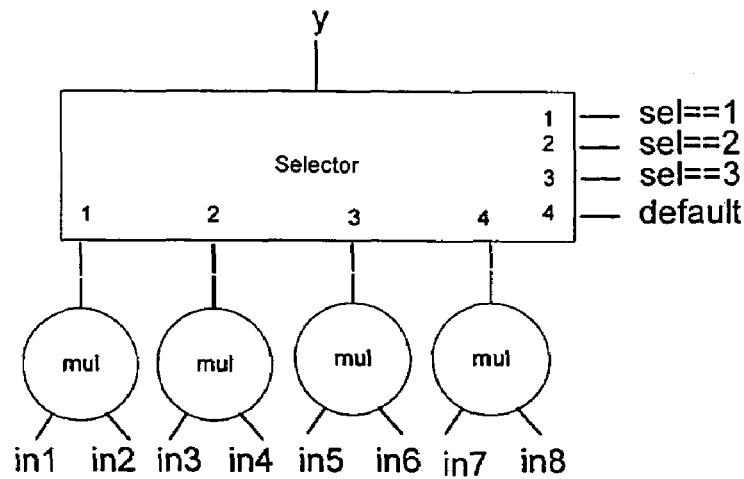
Figure 4C:
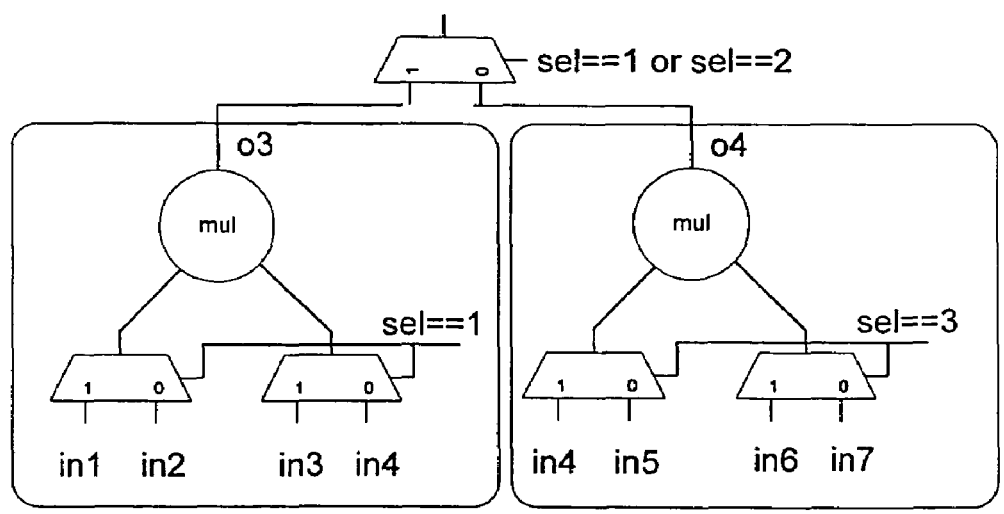

Continuing the multiplier sharing example, the golden circuit of the four multipliers may have been originally synthesized as depicted in FIG. 4B. Moreover, the revised circuit may have synthesized the multipliers as depicted in FIG. 4C. By performing conditional similarity analysis for all possible multiplier sharing pairs, the design verification system can determine that output function of (FIG. 4A) of sharing pair (m1, m2) is similar to output function o3 in the revised circuit (FIG. 4C). Likewise, output function o2 (FIG. 4A) of sharing pair (m3, m4) is found to be similar to output function o4 in revised circuit (FIG. 4C). The design verification system can apply learned pair-wise sharing information gleaned from analyzing the revised circuit and resynthesize the golden circuit to have the same or similar resource sharing arrangement as the revised circuit shown in FIG. 4C.

IV. Operator Ordering Learning

Figure 5:
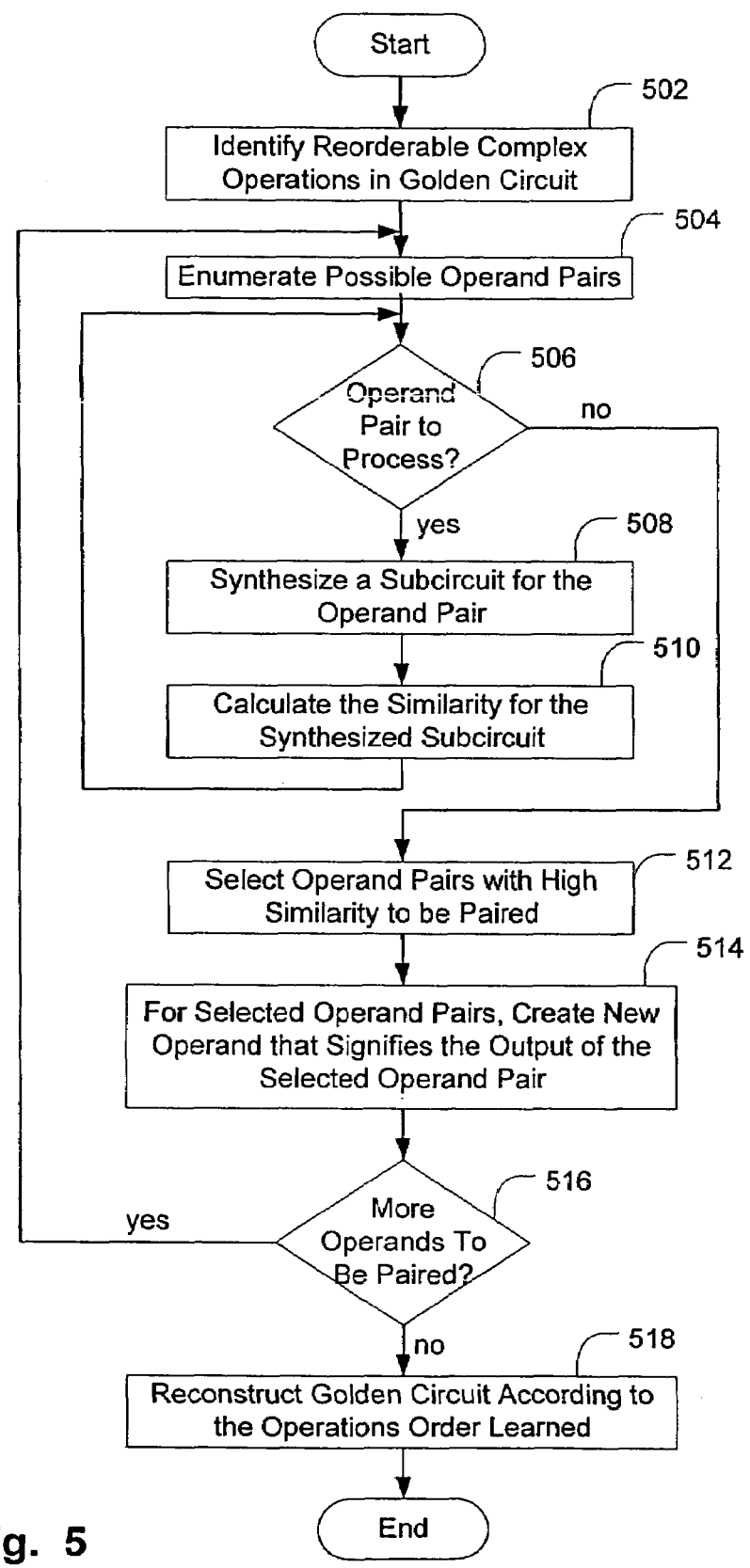
FIG. 5 is a flow chart of an exemplary method for performing operator ordering learning, according to one embodiment.

FIG. 5 is a flow chart of an exemplary method for performing operator ordering learning, according to one embodiment. For example, a circuit designer may use the design verification system to check the functional equivalence between a previously created golden circuit and its corresponding revised circuit. In checking the functional equivalence between the previously created golden circuit and its corresponding revised circuit, the design verification system can perform operator ordering learning by analyzing the golden circuit and identifying reorderable complex operations in the golden circuit (step 502). In particular, the design verification system identifies the operands in the reorderable complex operations.

For example, A+B+C can be implemented by different merging sequences: (A+B)+C, (A+C)+B, or (B+C)+A. Similarly, A*B*C can also be implemented by different merging sequences. If two operations can be swapped in an RTL expression, the design verification system can reorder the two operations. In a complex operation that contains more than two operations inside, and where each operator in the operation can be swapped, then the whole operation sequence can potentially be reordered. For example, in a complex operation (A+B+C+D)*E, three additions in the inside operation A+B+C+D can be reordered.

The design verification system creates and enumerates possible operand pairs from the operands found in the reorderable complex operations (step 504). For each operand pair (step 506), the design verification system synthesizes a subcircuit for the operand pair that is currently being processed, (step, 508). For example, the design verification system creates a gate-level representation of a subcircuit for the operand pair. Thus, the design verification system makes a guess as to the ordering of the operands in the complex operation.

The design verification system then analyzes the revised circuit to identify a subcircuit that is similar to the synthesized subcircuit. Having identified a corresponding subcircuit in the revised circuit, the design verification system calculates a similarity between the synthesized subcircuit and the corresponding subcircuit (step 510). The design verification system synthesizes a subcircuit (step 508) and calculates the similarity of the synthesized subcircuit (step 510) for each of the possible operand pairs.

Having processed each of the possible operand pairs, the design verification system selects the operand pairs whose subcircuits have high similarity with the corresponding subcircuits in the revised circuit (step 512). The design verification system pairs the selected operand pairs identified as having high similarity with the revised circuit and creates a new operand that signifies the output of each selected operand pair (step 514). The newly created operand can be considered an intermediate operand. The design verification system continues processing the intermediate operand and the operands that were not selected as having enough similarity with the revised circuit.

The design verification system determines if all the operands have been processed (step 516). If all the operands, including the intermediate operands, have not been processed, the design verification system repeats steps 504 to 514 until the operands have been processed. If all the operands have been processed, the design verification system resynthesizes the reorderable complex operation in the golden circuit according to the operations order learned from the revised circuit (step 518). The design verification system processes the reorderable complex operations in the golden circuit and ends processing.

Figure 6A:
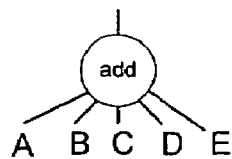
FIGS. 6A–C illustrate an operator ordering learning example.
Figure 6B:
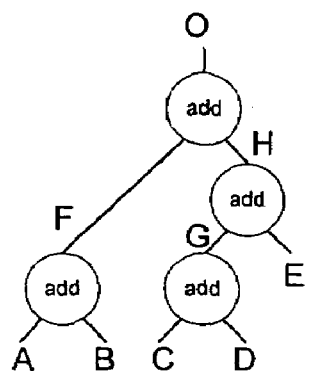
Figure 6C:
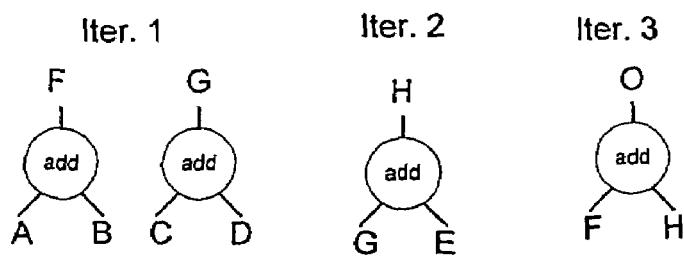

By way of example, the operators in a complex operation A+B+C+D+E can potentially be reordered. FIGS. 6A–C illustrate this operator ordering learning example. FIG. 6A depicts an exemplary golden circuit representation of the complex operation A+B+C+D+E involving the operands A, B, C, D, and E. The revised circuit may have synthesized the complex operation A+B+C+D+E as depicted in FIG. 6B. The design verification system enumerates the possible operand pairs (A+B), (A+C), (A+D), (A+E), (B+C), (B+D), (B+E), (C+D), (C+E), and (D+E).

For each operand pair, a subcircuit is synthesized. For each subcircuit, the design verification system identifies a corresponding subcircuit in the revised circuit and calculates a similarity between the synthesized subcircuit and the corresponding subcircuit in the revised circuit. The design verification system then selects the operand pairs (i.e., synthesized subcircuit) having high similarities, and creates an intermediate operand by pairing the selected operand pairs.

In the current example, the operand pairs (A+B) and (C+D) are determined to be highly similar (e.g., the operands A and B are added together and the operand C and D are added together in FIG. 6B). The design verification system creates an intermediate operand for (A+B) and (C+D), respectively (FIG. 6C). Next, the design verification system enumerates the possible operand pairs (F+G), (F+E), and (G+E), and for each operand pair, a subcircuit is synthesized. The design verification system calculates a similarity for each operand pair, and selects the operand pair (G+E) due to its high similarity. Finally, only two operands F and H are left. The addition (F+H) is therefore the only choice. Using the information learned during the iterative operator order learning process (FIG. 6C), the design verification system can resynthesize the complex operation A+B+C+D+E in the golden circuit to nave an adder tree structure that is the same or similar to the corresponding structure in the revised circuit (FIG. 6B).

V. Multiplier Learning

Figure 7:
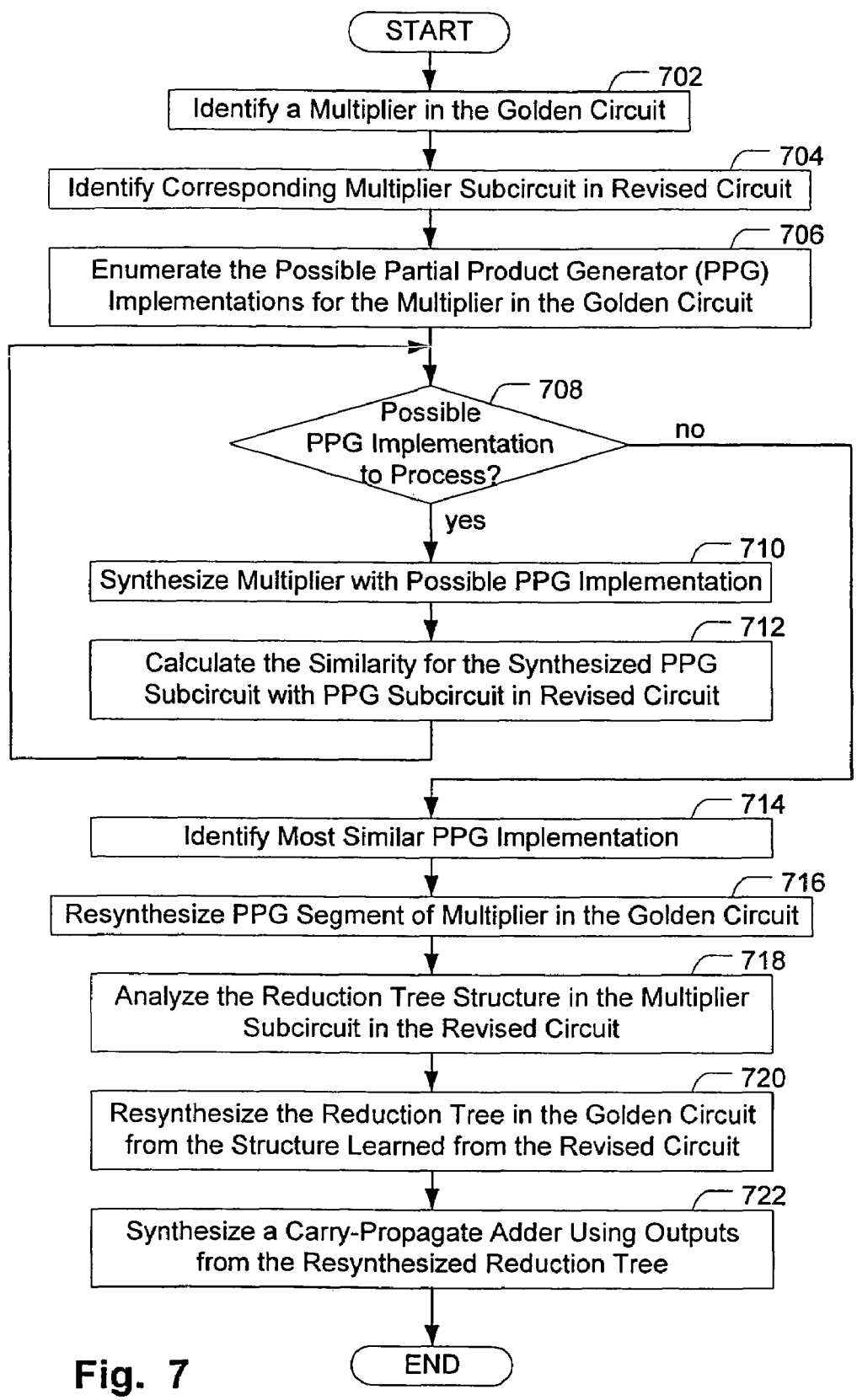
FIG. 7 is a flow chart of an exemplary method for performing multiplier learning, according to one embodiment.

FIG. 7 is a flow chart of an exemplary method for performing multiplier learning, according to one embodiment. Multiplier architectures typically consist of three parts or segments: a partial product generator (PPG), a reduction tree, and a final adder. The outputs of the partial product generators feed into the reduction tree. Each column in the reduction tree uses half and/or full adders to reduce the output bits from partial product generator until the number of outputs in each column is less than two. The final adder sums the outputs of the reduction tree into the final product. Resynthesis of the multiplier in the golden circuit involves learning the PPG and the reduction tree structures in the revised circuit. The learned structures are then applied to construct a similar or same structure for the multiplier in the golden circuit. A valid carry-propagate adder for the final adder implementation is constructed in the golden circuit.

In checking the functional equivalence between a previously created golden circuit and its corresponding revised circuit, the design verification system can perform multiplier learning by identifying a multiplier in the golden circuit (step 702). The design verification system analyzes the revised circuit and identifies a multiplier subcircuit in the revised circuit that corresponds to the identified multiplier (step 704). The corresponding multiplier subcircuit in the revised circuit can be found using mapping methods used by conventional equivalence checkers.

The design verification system enumerates the possible PPG implementations for the identified multiplier in the golden circuit (step 706). The design verification system can guess at the PPG implementation of the identified multiplier in the golden circuit from the enumerated list. For each possible PPG implementation (step 708), the design verification system takes a possible PPG implementation and synthesizes a PPG subcircuit for the identified multiplier in the golden circuit (step 710). The design verification system calculates a similarity between the synthesized PPG subcircuit and the PPG subcircuit of the corresponding multiplier in the revised circuit (step 712). The design verification system synthesizes a subcircuit (step 710) and calculates the similarity of the synthesized subcircuit (step 712) for each of the possible PPG implementations.

Having processed each of the possible PPG implementations, the design verification system identifies the possible PPG implementation that is most similar to the PPG subcircuit of the corresponding multiplier in the revised circuit (step 714). The design verification system uses the identified PPG implementation to resynthesize the PPG segment of the multiplier in the golden circuit (step 716). Thus, the multiplier in the golden circuit has a PPG that is similar or identical to the PPG structure of the corresponding multiplier in the revised circuit.

The design verification system analyzes and learns the reduction tree structure of the corresponding multiplier in the revised circuit (step 718). The design verification system uses the information learned from the revised circuit to resynthesize the reduction tree segment of the multiplier in the golden circuit (step 720). Thus, the multiplier in the golden circuit has a reduction tree that is similar or identical to the reduction tree structure of the corresponding multiplier in the revised circuit. The design verification system synthesizes a carry-propagate adder using outputs from the resynthesized reduction tree in the golden circuit (step 722). The design verification system processes the multipliers in the golden circuit and ends processing.

Figure 8:
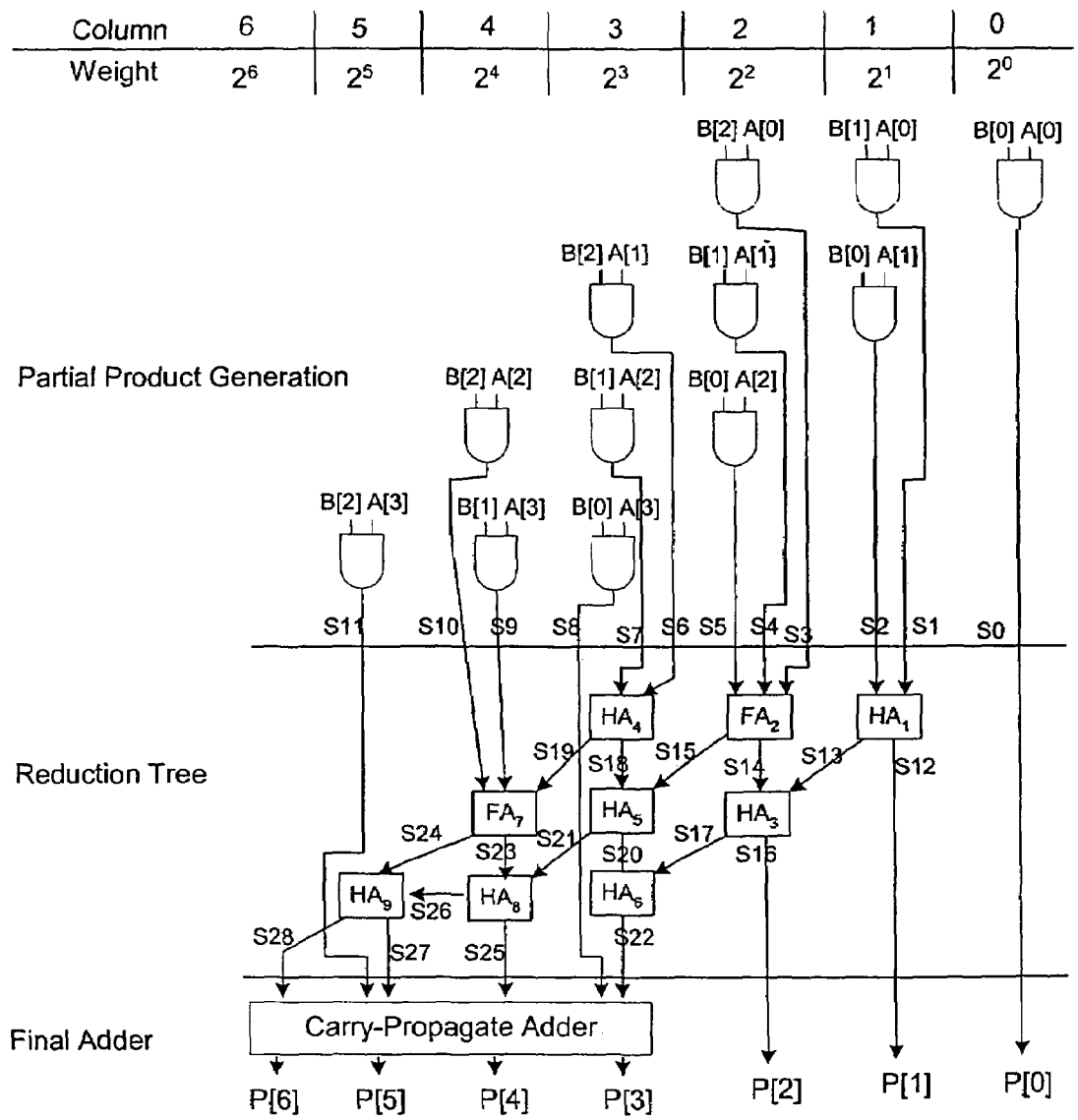
FIG. 8 illustrates a multiplier learning example.

FIG. 8 illustrates a multiplier learning example. In particular, FIG. 8 depicts a Carry Save Adder (CSA) multiplier for the multiplication example P[6:0]=A[3:0]*B[2:0]. The multiplier learning and resynthesis involves PPG learning, reduction tree learning, and final adder construction.

PPG Learning

To learn the PPG structure of the corresponding multiplier in the revised circuit, different known PPG subcircuit implementations will be tried for the multiplier in the golden circuit. Additionally, for the aforementioned multiplier example, two operand orderings, A*B and B*A, will be tried for each PPG subcircuit implementation. The PPG subcircuit implementation that has the highest similarity with the PPG subcircuit structure of the corresponding multiplier in the revised circuit will be selected and used to resynthesize the multiplier in the golden circuit. In addition, the corresponding outputs of the selected PPG subcircuit in the revised circuit will be used for reduction tree learning. For the example in FIG. 8, the signals S0 to S11 are fed into the reduction tree subcircuit and used to team and construct the reduction tree structure of the corresponding multiplier in the revised circuit.

Reduction Tree Learning

The reduction tree structure comprises a set of columns having one or more signals. Each signal inside a column carries a partial sum having the corresponding weight of that column. For the example in FIG. 8, the signals S3, S4, S5, S13, S14, and S16 fall in column 2, and each have the weight of 4. Each column of reduction tree consists of full adders and/or half adders as depicted in FIG. 8. A full adder receives three inputs signals and generates as outputs one carry signal and one sum signal, with the carry signal feeding into an adjacent column. The half adder receives two input signals and generates as outputs one carry signal and one sum signal, with the carry signal feeding into an adjacent column.

The reduction tree learning process starts from rightmost column in the reduction tree structure of the corresponding multiplier in the revised circuit. In each column, the design verification system attempts to learn the maximal number of full and half adders in that column. The design verification system learns the maximum number of adders in a particular column and proceeds to the next adjacent column to the left. While processing a column, the design verification system creates or generates a BDD function, or other canonical logic representation, for each signal based on the learned information and data regarding the signals. The signals are either outputs of the PPG or internal outputs of the adders identified and learned in the columns.

For example, a full or half adder is identified and learned in a column when both its sum and carry functions (i.e., signals) are found in the corresponding multiplier in the revised circuit. The carry signal of the newly identified or learned adder is then fed or input into the next adjacent column to the left. The sum signal of the newly learned adder is used as a new signal to incrementally generate the BDD function.

Thus, the reduction tree learning process inside each column involves:

1) Generating the BDD functions from the lowest circuit level whose logic has not yet been recognized as adders. The BDD functions are built in breadth-first fashion until an adder is learned or no more levels are left.
2) If an adder is learned, mark the corresponding logic as a learned adder and go to step 1, otherwise stop.

For the multiplier example in FIG. 8, the reduction tree learning starts from column 1, proceeds to column 2, etc., and stops at column 6. In column 1, the design verification system identifies and learns that signals S12=S2^S1 and S13=S2&S1 are the sum and carry functions, respectively, of half adder S1+S2, which is labeled as HA1. The carry signal S13 of HA1 is then treated as an input to column 2. Since there is no more logic to be learned in column 1, the learning proceeds to column 2.

In column 2, the design verification system identifies and learns that signals S15=(S3&S4)||S3&S5)||(S4&S5) and S14=S3^S4^S5 are the carry and sum functions, respectively, of full adder S3+S4+S5, which is labeled as FA2. Similarly, signals S16=S13^S14 and S17=S13&S14 are identified as the sum and carry functions, respectively, of half adder S13+S14, labeled as HA3. The learning process repeats this learning process to learn the existence of adders HA4, HA5, HA6, FA7, HA8 and HA9. The design verification system uses the learned reduction tree structure to synthesize a reduction tree structure for the multiplier in the golden circuit.

Final Adder Construction

In most cases, the similarity of final adder does not impact the efficiency of the design verification system. Thus, in some embodiments, the learning process for the final adder can be omitted and a common final adder implementation can be synthesized for the multiplier in the golden circuit. This can be done by summing up the outputs from the resynthesized reduction tree segment of the multiplier in the golden circuit.

VI. Operator Merging Learning

If a complex operation can be expressed in a summation form, then the summation operations can be merged together and implemented by one or more Carry Save Adders to increase efficiency and speed. For example, A+B+C can be implemented by a reduction tree followed by a final adder. The reduction tree and final adder combination is similar to that previously disclosed in conjunction with the aforementioned multiplier learning. In addition, the reduction tree and final adder of a multiplier are also in summation form. Therefore, the reduction tree and final adder of a multiplier can be merged with other multipliers or adders. Once the operation is expressed in summation form, the same learning procedure disclosed in conjunction with the aforementioned reduction tree learning and final adder construction can be applied.

VII. Calculating Similarity Between Two Subcircuit Representations

The design verification system calculates the similarity (e.g., determines the similarity) between a subcircuit in the golden circuit with a corresponding subcircuit in the revised circuit. In one embodiment, the design verification system employs a search-and-compare methodology, or variations of the search-and-compare methodology, to identify corresponding subcircuits in the revised circuit. For example, the design verification system can use one or more characteristics of the synthesized subcircuit in the golden circuit to reduce the search area or space in the revised circuit. The design verification system uses one or more characteristics to eliminate certain portions of the revised circuit as potentially containing a corresponding subcircuit.

In similarity calculation, the design verification system may reasonably assume that the corresponding signals in the revised circuit for those inputs of the subcircuit in the golden circuit are already identified by conventional mapping method used in conventional equivalence checkers. If an appropriate signal is not found in the revised circuit, the design verification system can identify a minimum support in the golden circuit for the particular signal in the synthesized subcircuit. The design verification system can then look for the corresponding signals of the minimum support in the revised circuit. The support is gradually increased until the corresponding signals are identified in the revised circuit.

For example, if signal in11 (FIG. 4A) is not found in the revised circuit, the design verification system can identify a minimum support for the signal in1 in the synthesized subcircuit. The minimum support can be searched from the golden circuit that supports signal in1 until the corresponding signals of the support can be found in the revised circuit by conventional mapping methods. The minimum support can be considered as the new input, to replace the input signals it supports, in the similarity analysis.

In one embodiment, the similarity between two subcircuits can be determined by checking, for example, the similarity of subcircuit structure, the similarity of boolean functions, the similarity of simulation results, and the like. Comparison of other subcircuits characteristics are envisioned to determine the degree of similarity between two subcircuits. Furthermore, the design verification system can utilize any combination of the aforementioned comparison methods to determine the degree of similarity.

The design verification system can check the similarity between the structure of a subcircuit in the golden circuit with the structure of a corresponding subcircuit in the revised circuit to determine if the two subcircuits are similar. Checking the subcircuit structure may involve a check of the subcircuit topology (e.g., the structure of the subcircuit tree), a check of the levels in the subcircuits (e.g., how many levels are in each subcircuit structure), a check of the subcircuit structure shape (e.g., tree skewness, tree depth, etc.), and the like. Furthermore, the design verification system can use the outputs of the subcircuit in the golden circuit to narrow the field or area of search in the revised circuit in finding a corresponding subcircuit.

For example, the synthesized multiplier subcircuit in FIG. 4A has an output o1 and inputs in1, in2, in3, and in4. In attempting to find a corresponding subcircuit in the revised circuit, the design verification system identifies the applicable resource subcircuits (i.e., multipliers in the current example) in the revised circuit and checks the outputs of the identified resources. For example, the revised circuit in FIG. 4C has one multiplier subcircuit that has an output o3 and inputs in1 to in4, and another multiplier subcircuit that has an output o4 and inputs in4 to in7. From this learned information (e.g., inputs, topology, levels, shape, etc.), the design verification system can determine that the multiplier subcircuit with output o1 in the golden circuit is structurally similar to the multiplier subcircuit with output o3 in the revised circuit.

The design verification system can check the similarity between the boolean functions of a subcircuit in the golden circuit with the boolean functions of a corresponding subcircuit in the revised circuit to determine if the two subcircuits are similar. For example, for the synthesized multiplier subcircuit in FIG. 4A, the design verification system can check the boolean function(s) of the subcircuit output (i.e., o1) against each signal in the revised circuit, and in particular, the boolean function associated with each particular signal in the revised circuit. The degree of similarity between the compared boolean function(s) can be used to determine the similarity of the synthesized subcircuit and the subcircuit defined by the boolean function(s) in the revised circuit, for both positive and inverted phases. (That means, if a function f in a golden circuit is inverse equivalent to a function g (i.e., f=not g), it is considered as having high similarity). Furthermore, the design verification system can use the input signals (e.g., in1 to in4) to narrow the areas of search in the revised circuit. For example, areas in the revised circuit that do not contain the input signals are not likely to contain the corresponding subcircuit and thus, are not searched.

The design verification system can determine the degree of similarity between a subcircuit in the golden circuit and a corresponding subcircuit in the revised circuit by performing simulation on the two subcircuits and comparing the simulation results. The design verification system created the synthesized subcircuit in the golden circuit and thus, knows the inputs signals in the synthesized subcircuit. The design verification system analyzes the revised circuit and searches for and identifies signals that are the same as the output signals in the synthesized subcircuit. The simulation tries to find similar output signals in the revised design. The simulation can be performed by providing the same test vectors at the input signals of the golden subcircuit and the corresponding signals in the revised circuit. Identification of the input signals in the revised circuit alone is not sufficient to identifying the subcircuit in the revised circuit. The similar output signals in the revised circuit can be key to finding the subcircuit in the revised design.

For example, for the synthesized multiplier subcircuit in FIG. 4A, the design verification system knows that the multiplier sharing (m1, m2) has signals in1 to in4. The corresponding signals in1 to in4 in the revised circuit can be identified by a conventional mapping method. The design verification system can feed a set of random vectors into the inputs in both the golden and revised circuit to perform the simulation. The design verification system then searches for the signals that carry the same simulation values as signal o1 in the golden circuit. By doing this, signal o3 can be found in FIG. 4C and the subcircuit in the revised design is identified as the logic cone whose fanouf is o3 and fanin is in1 to in4. In a manner similar to that in boolean similarity, both phases of the simulation results can be searched in the revised circuit.

This invention may be provided in other specific forms and embodiments without departing from the essential characteristics as described herein. The embodiments described above are to be considered in all aspects as illustrative only and not restrictive in any planner. The following claims rather than the foregoing description indicate the scope of the invention.

What is claimed is:

1. A method for verifying a circuit design comprising:
   generating a circuit design;
   synthesizing the circuit design to create a first gate-level representation of the circuit design;
   generating and analyzing a second gate-level representation of the circuit design to learn architecture information by identifying similarities between the first and second gate-level representations of the circuit design; and
   resynthesizing the first gate-level representation of the circuit design by replacing at least a portion of the architecture of the first gate-level representation of the circuit design with substantially similar architecture of the second gate-level representation of the circuit design.

2. The method of claim 1, wherein the second gate-level representation being created during a synthesis process.

3. The method of claim 1, wherein the learned architecture information comprises logic network architecture in the second gate-level representation of the circuit design.

4. The method of claim 1, wherein the analyzing comprises a resource sharing learning.

5. A computer-readable storage medium having stored thereon computer instructions that, when executed by a computer, cause the computer to:
   synthesize a circuit design to create a first gate-level representation of the circuit design;
   generate and analyze a second gate-level representation of the circuit design to learn architecture information by identifying similarities between the first and second gate-level representations of the circuit design; and
   resynthesize the first gate-level representation of the circuit design by replacing at least a portion of the architecture of the first gate-level representation of the circuit design with substantially similar architecture of the second gate-level representation of the circuit design.

6. The computer-readable storage medium of claim 5, wherein the second gate-level representation being created during a synthesis process.

7. The computer-readable storage medium of claim 5, wherein the learned architecture information comprises logic network architecture in the second gate-level representation of the circuit design.

8. The computer-readable storage medium of claim 5, herein the analyzing comprises a resource sharing learning.

9. A system for verifying a circuit design comprising:
   means for synthesizing a circuit design to create a first gate-level representation of the circuit design;
   means for generating and analyzing a second gate-level representation of the circuit design to learn architecture information by identifying similarities between the first and second gate-level representations of the circuit design; and means for resynthesizing the first gate-level representation of the circuit design by replacing at least a portion of the architecture of the first gate-level representation of the circuit design with substantially similar architecture of the second gate-level representation of the circuit design.

10. The system of claim 9, wherein the second gate-level representation is created during a synthesis process.

11. The system of claim 9, wherein the learned architecture information comprises logic network architecture in the second gate-level representation of the circuit design.

12. The system of claim 9, wherein the means for analyzing comprises a resource sharing learning.

* * * * *